United States Patent
Moosburger

(10) Patent No.: US 10,797,026 B2
(45) Date of Patent: Oct. 6, 2020

(54) VIDEO WALL MODULE AND METHOD OF PRODUCING A VIDEO WALL MODULE

(71) Applicant: OSRAM OLED GmbH, Regensburg (DE)

(72) Inventor: Jürgen Moosburger, Lappersdorf (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/079,370

(22) PCT Filed: Feb. 24, 2017

(86) PCT No.: PCT/EP2017/054299
§ 371 (c)(1),
(2) Date: Aug. 23, 2018

(87) PCT Pub. No.: WO2017/144650
PCT Pub. Date: Aug. 31, 2017

(65) Prior Publication Data
US 2019/0057955 A1 Feb. 21, 2019

(30) Foreign Application Priority Data
Feb. 25, 2016 (DE) .................. 10 2016 103 324

(51) Int. Cl.
*H01L 25/075* (2006.01)
*G09G 3/32* (2016.01)
(Continued)

(52) U.S. Cl.
CPC ........ *H01L 25/0753* (2013.01); *G09F 9/3026* (2013.01); *G09G 3/32* (2013.01);
(Continued)

(58) Field of Classification Search
USPC ......................................... 345/1.3
See application file for complete search history.

(56) References Cited

U.S. PATENT DOCUMENTS

| | | | |
|---|---|---|---|
| 2003/0058650 A1* | 3/2003 | Shih ................ | H01L 33/647 362/294 |
| 2009/0302429 A1 | 12/2009 | Plössl et al. | |

(Continued)

FOREIGN PATENT DOCUMENTS

| | | |
|---|---|---|
| DE | 10 2015 100 294 A1 | 7/2015 |
| EP | 1 501 069 A1 | 1/2005 |

(Continued)

OTHER PUBLICATIONS

Notice for Reasons for Rejection dated Aug. 6, 2019, of counterpart Japanese Application No. 2018-541219, in English.
(Continued)

*Primary Examiner* — Chineyere D Wills-Burns
(74) *Attorney, Agent, or Firm* — DLA Piper LLP (US)

(57) ABSTRACT

A video wall module includes a plurality of light emitting diode chips, each including first contact electrodes and second contact electrodes arranged at a contact side, wherein the light emitting diode chips are arranged at a top side of a multilayer circuit board, and the contact electrodes electrically conductively connect to a first metallization layer arranged at the top side of the circuit board.

16 Claims, 11 Drawing Sheets

(51) Int. Cl.

| | | |
|---|---|---|
| *H01L 33/62* | (2010.01) | |
| *H05K 1/02* | (2006.01) | |
| *H05K 3/28* | (2006.01) | |
| *H05K 1/18* | (2006.01) | |
| *H05K 3/32* | (2006.01) | |
| *G09F 9/302* | (2006.01) | |
| *H01L 23/538* | (2006.01) | |
| *H01L 33/36* | (2010.01) | |
| *H01L 33/54* | (2010.01) | |
| *H01L 23/00* | (2006.01) | |

(52) U.S. Cl.
CPC ...... *H01L 23/5383* (2013.01); *H01L 23/5386* (2013.01); *H01L 33/36* (2013.01); *H01L 33/54* (2013.01); *H01L 33/62* (2013.01); *H05K 3/323* (2013.01); *G09G 2300/026* (2013.01); *G09G 2300/0426* (2013.01); *G09G 2300/0452* (2013.01); *G09G 2300/06* (2013.01); *H01L 24/32* (2013.01); *H01L 24/83* (2013.01); *H01L 2224/32227* (2013.01); *H01L 2224/838* (2013.01); *H01L 2224/83039* (2013.01); *H01L 2924/12041* (2013.01); *H01L 2933/005* (2013.01); *H01L 2933/0066* (2013.01); *H05K 1/0298* (2013.01); *H05K 1/181* (2013.01); *H05K 3/284* (2013.01); *H05K 2201/10106* (2013.01)

(56) References Cited

U.S. PATENT DOCUMENTS

| | | | |
|---|---|---|---|
| 2011/0042796 A1* | 2/2011 | Chang | H01L 23/5389 257/690 |
| 2011/0312157 A1 | 12/2011 | Lei et al. | |
| 2013/0100694 A1* | 4/2013 | Chen | G02B 6/0085 362/602 |
| 2013/0128585 A1* | 5/2013 | Bibl | H01L 27/15 362/259 |
| 2015/0054008 A1* | 2/2015 | Rhee | H01L 25/0753 257/89 |
| 2015/0171297 A1 | 6/2015 | Rhee et al. | |
| 2015/0200338 A1* | 7/2015 | Kim | H01L 24/97 257/88 |
| 2015/0294951 A1* | 10/2015 | Smits | B23K 35/262 438/119 |
| 2015/0371585 A1* | 12/2015 | Bower | H01L 33/38 345/1.1 |
| 2016/0004123 A1* | 1/2016 | Tanabe | G02F 1/133606 362/97.3 |
| 2016/0351539 A1* | 12/2016 | Bower | H01L 25/0655 |
| 2017/0038055 A1* | 2/2017 | Daniels | H01L 24/00 |
| 2017/0103926 A1 | 4/2017 | Aoyagi et al. | |
| 2017/0278734 A1* | 9/2017 | Zou | H01L 21/67144 |
| 2018/0204823 A1* | 7/2018 | Schwarz | H01L 33/62 |

FOREIGN PATENT DOCUMENTS

| | | |
|---|---|---|
| EP | 1 548 573 A1 | 6/2005 |
| EP | 2 763 174 A2 | 8/2014 |
| JP | 2009-537970 A | 10/2009 |
| JP | 2013-535114 A | 9/2013 |
| JP | 2015-197544 A | 11/2015 |
| JP | 2016-018877 A | 2/2016 |
| WO | 99/41787 A1 | 8/1999 |

OTHER PUBLICATIONS

German Search Report dated Jan. 16, 2017 of corresponding German Application No. 10 2016 103 324.3.

* cited by examiner

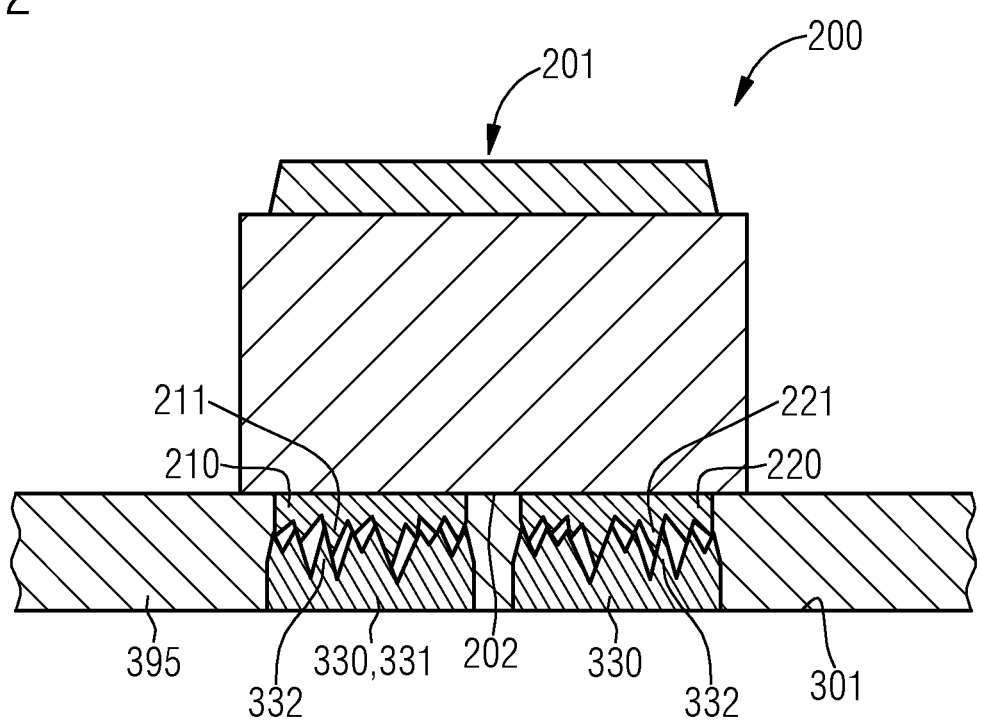

US 10,797,026 B2

VIDEO WALL MODULE AND METHOD OF PRODUCING A VIDEO WALL MODULE

TECHNICAL FIELD

This disclosure relates to a video wall module and a method of producing a video wall module.

BACKGROUND

Video wall modules for constructing video walls are known. Video walls are display panels for static or moving pictures in which each pixel is formed by one or more light emitting diode chips (LED chips). To achieve a high display quality, small distances of the pixels from one another, a high contrast and a uniform light emission in different spatial directions are desirable.

SUMMARY

I provide a video wall module including a plurality of light emitting diode chips, each including first contact electrodes and second contact electrodes arranged at a contact side, wherein the light emitting diode chips are arranged at a top side of a multilayer circuit board, and the contact electrodes electrically conductively connect to a first metallization layer arranged at the top side of the circuit board.

I also provide a method of producing a video wall module including providing a multilayer circuit board including a first metallization layer arranged at a top side of the circuit board; providing a plurality of light emitting diode chips, wherein each light emitting diode chip includes a contact side including a first contact electrode arranged at the contact side and a second contact electrode arranged at the contact side; and arranging the light emitting diode chips at the top side of the circuit board, wherein the contact electrodes electrically conductively connect to the first metallization layer.

I further provide a video wall module including a plurality of light emitting diode chips, each including first contact electrodes and second contact electrodes arranged at a contact side, wherein the light emitting diode chips are arranged at a top side of a multilayer circuit board, at the contact side of each light emitting diode chip there is arranged in each case a patterned section of a conductive die attach film that electrically conductively connects the contact electrodes of the light emitting diode chip to a first metallization layer arranged at the top side of the circuit board.

BRIEF DESCRIPTION OF THE DRAWINGS

FIG. 12 schematically shows a sectional side view of a light emitting diode chip secured by an electrically insulating adhesive.

LIST OF REFERENCE SIGNS

Figure 1:
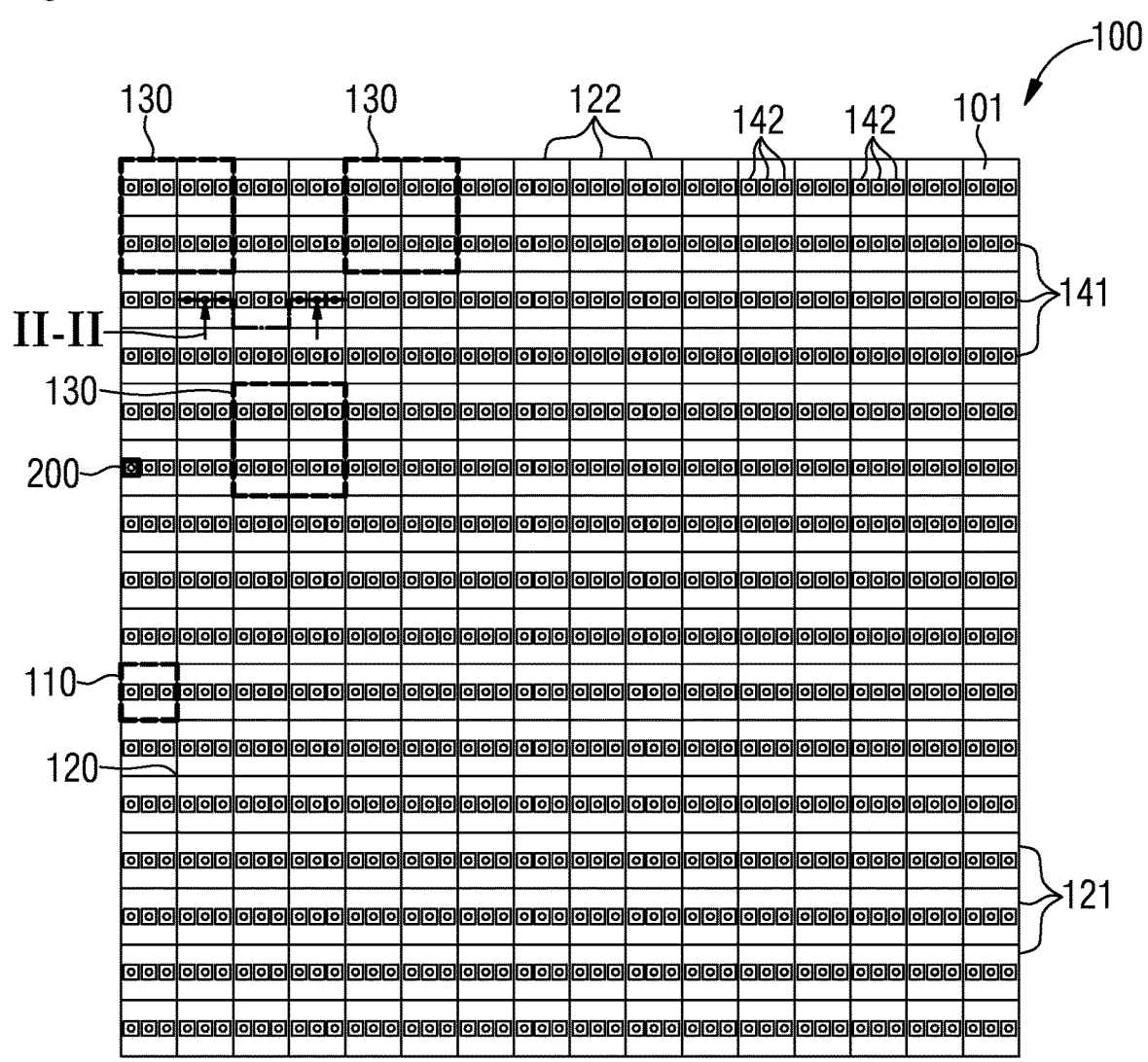
FIG. 1 schematically shows a plan view of pixels of a video wall module.

100 Video wall module
101 Front side
102 Rear side
110 Pixel
120 Rectangular grid
121 Row of pixels
122 Column of pixels
130 Block (comprising four pixels)
140 Cross-matrix interconnection
141 Logical row
142 Logical column
200 Light emitting diode chip
201 Radiation emission side
202 Contact side
210 First contact electrode
211 Metal tip
220 Second contact electrode
221 Metal tip
300 Circuit board
301 Top side
310 First circuit board layer
311 First upper through contacts
312 Second upper through contacts
320 Second circuit board layer
321 Lower through contacts
330 First metallization layer
331 Column line
332 Metal tip
340 Second metallization layer
341 Row line
342 Row connection structure
343 Column connection structure
350 Third metallization layer
351 Electrical contact pad
360 Third circuit board layer
361 Electronic component
370 Potting material
380 Conductive die attach film
390 Anisotropically conductive film
395 Electrically insulating adhesive
400 Fourth metallization layer
401 Electrical contact pad

DETAILED DESCRIPTION

My video wall module comprises a plurality of light emitting diode chips, each comprising first contact electrodes and second contact electrodes arranged at a contact side. The light emitting diode chips are arranged at a top side of a multilayer circuit board. The contact electrodes electrically conductively connect to a first metallization layer arranged at the top side of the circuit board.

Advantageously, in light emitting diode chips of this video wall module, the first contact electrodes and the second contact electrodes are arranged at the same sides of the light emitting diode chips. As a result, the light emitting diode chips in this video wall module may be electrically contacted in a simple manner. In particular, no contacting structures arranged above the light emitting diode chips are required in this video wall module. As a result, the video wall module may be produced cost-effectively and is formed in a robust fashion and in a manner that is insensitive to damage.

At the contact side of each light emitting diode chip there may be arranged in each case a patterned section of a conductive die attach film that electrically conductively connects the contact electrodes of the light emitting diode chip to the first metallization layer. Advantageously, this enables a simple and reliable electrical contacting of the light emitting diode chips even when the light emitting diode chips comprise very small edge lengths and the contact electrodes of the light emitting diode chips are arranged very close to one another. In particular, by providing the sections of the conductive die attach film for producing the electrically conductive connections between the contact electrodes of the light emitting diode chips and the first metallization layer, electrical short circuits between the contact electrodes of the light emitting diode chips may be avoided.

An anisotropically conductive film may be arranged at the top side of the circuit board, the anisotropically conductive film electrically conductively connecting the contact electrodes of the light emitting diode chips to the first metallization layer. Advantageously, the anisotropically conductive film enables a simple and reliable electrical contacting of the light emitting diode chips even when the light emitting diode chips comprise small edge lengths. In particular, by providing the anisotropically conductive film, an occurrence of short circuits between the contact electrodes of the light emitting diode chips may be prevented.

The light emitting diode chips may be at least partly embedded into a potting material arranged at the top side of the circuit board. Advantageously, the light emitting diode chips are thereby protected against damage as a result of external influences. The potting material additionally forms an advantageous, smooth and uniform surface at the top side of the video wall module which, depending on the application, may comprise a desired high or low optical reflectivity. For this purpose, the potting material may be chosen with suitable optical reflection properties.

The circuit board may comprise a second metallization layer. In this case, sections of the first metallization layer and sections of the second metallization layer electrically conductively connect to one another by through contacts arranged in the circuit board. Advantageously, the metallization layers of the circuit board of the video wall module enable a complex electrical interconnection of the light emitting diode chips of the video wall module. In particular, line crossovers are also made possible by the presence of a first metallization layer and a second metallization layer.

The light emitting diode chips may be logically distributed among rows and columns of a matrix. In this case, the first contact electrodes of the light emitting diode chips electrically conductively connect to one another column by column by the first metallization layer. The second contact electrodes of the light emitting diode chips electrically conductively connect to one another row by row by the second metallization layer. The light emitting diode chips of the video wall module are thus arranged in a cross-matrix interconnection. The latter advantageously makes it possible to drive all the light emitting diode chips of a logical row of the matrix simultaneously independently of one another, while the light emitting diode chips of the remaining rows of the matrix are not driven. The individual rows of the matrix may be driven temporally successively in multiplexing operation. This enables each of the light emitting diode chips of the video wall module to be operated independently of the remaining light emitting diode chips of the video wall module, without the need to provide independent control lines specific to each light emitting diode chip of the video wall module.

The circuit board may comprise a third metallization layer. In this case, sections of the second metallization layer and sections of the third metallization layer electrically conductively connect to one another by through contacts arranged in the circuit board. Advantageously, the third metallization layer offers additional degrees of freedom in the design of the electrical interface of the video wall module.

The third metallization layer may form external electrical contact pads of the video wall module. Advantageously, the third metallization layer enables the geometry of the external electrical contact pads to be adapted to a desired field of application. One advantage of the video wall module may consist in the fact that the number of external electrical contact pads may be lower than the number of light emitting diode chips of the video wall module as a result of which the video wall module may be formed with compact external dimensions and be electrically contactable in a simple manner.

The circuit board may comprise integrated electronic components. The electronic components integrated into the circuit board may drive the light emitting diode chips of the video wall module. By way of example, the electronic components integrated into the circuit board may drive the light emitting diode chips of the video wall module interconnected in a cross-matrix interconnection in multiplexing operation. Advantageously, the video wall module may be usable in a particularly simple manner as a result of the integration of the driving electronics into the circuit board.

Two or three adjacent light emitting diode chips respectively may form a pixel. In this case, the light emitting diode chips jointly forming a pixel may be configured to emit light of different colors. By way of example, each of a light emitting diode chip that emits in the red wavelength range, a light emitting diode chip that emits in the green wavelength range and a light emitting diode chip that emits in the blue wavelength range may form a pixel of the video wall module. Advantageously, the video wall module thus enables a colored representation.

The pixels may be arranged in a rectangular grid at the top side of the circuit board. Advantageously, the video wall module is thereby well suited to displaying pictures composed of pixels.

The light emitting diode chips of a pixel may be arranged linearly alongside one another. Advantageously, this may result in a particularly high picture quality of the video wall module.

A method of producing a video wall module comprises steps of providing a multilayer circuit board comprising a first metallization layer arranged at a top side of the circuit board, providing a plurality of light emitting diode chips, wherein each light emitting diode chip comprises a contact side comprising a first contact electrode arranged at the contact side and a second contact electrode arranged at the contact side, and arranging the light emitting diode chips at the top side of the circuit board, wherein the contact electrodes electrically conductively connect to the first metallization.

Advantageously, this method makes it possible to use light emitting diode chips in which the first contact electrodes and the second contact electrodes are arranged at a common side of the light emitting diode chip. As a result, the production method does not require provision of a wiring structure arranged above the light emitting diode chips, as a result of which the video wall module obtainable by the method may be formed in a robust fashion and with little sensitivity to disturbances.

In the method, providing each light emitting diode chip may comprise steps of arranging a section of a conductive die attach film at the contact side of the light emitting diode chip, and patterning the conductive die attach film such that parts of the conductive die attach film in contact with the first contact electrode and with the second contact electrode are electrically isolated from one another. The light emitting diode chips may be arranged at the top side of the circuit board such that the respective section of the conductive die attach film electrically conductively connects the contact electrodes to the first metallization layer. Advantageously, the method thereby enables a simple and reliable electrical contacting of the electrical light emitting diode chips even when the light emitting diode chips are formed with a small edge length and only a small distance between the contact electrodes. In this case, in particular a formation of short circuits between the contact electrodes of the light emitting diode chips is prevented by the use of the conductive die attach film.

Patterning the conductive die attach film may be carried out by a laser. Advantageously, the patterning of the conductive die attach film is thereby possible particularly simply, rapidly and precisely.

The conductive die attach film may be arranged at a chip wafer comprising a plurality of light emitting diode chips. In this case, the light emitting diode chips are singulated together with the conductive die attach film after the process of patterning the conductive die attach film. Patterning the conductive die attach film is thus carried out while the light emitting diode chips are still in the wafer assemblage, as a result of which the method is able to be carried out particularly simply, rapidly and cost-effectively.

Arranging the light emitting diode chips at the top side of the circuit board may comprise steps of arranging an anisotropically conductive film at the top side of the circuit board, and arranging the light emitting diode chips at the top side of the circuit board such that the anisotropically conductive film electrically conductively connects the contact electrodes of the light emitting diode chips to the first metallization layer. Advantageously, this method enables a reliable electrical contacting of the light emitting diode chips even when the light emitting diode chips comprise a small size and a small distance between the contact electrodes. In particular, the use of the anisotropically conductive film may reduce the risk of forming short circuits between the contact electrodes of the light emitting diode chips.

Arranging the light emitting diode chips at the top side of the circuit board may comprise steps of applying an electrically insulating adhesive on the top side of the circuit board, and arranging the light emitting diode chips at the top side of the circuit board. In this case, microscopic metal tips of the contact electrodes of the light emitting diode chips and/or of the first metallization layer locally pierce the electrically insulating adhesive and electrically conductively connect the contact electrodes of the light emitting diode chips to the first metallization layer. Advantageously, this method enables a simple and reliable securing of the light emitting diode chips to the top side of the circuit board and at the same time a reliable electrical contacting of the light emitting diode chips even when the light emitting diode chips comprise a small size and a small distance between the contact electrodes.

The method may comprise a further step of arranging a potting material at the top side of the circuit board, wherein the light emitting diode chips are at least partly embedded into the potting material. Advantageously, the light emitting diode chips are protected against damage as a result of external influences by the embedding into the potting material. The potting material may additionally form a homogeneous top side comprising desired optical reflection properties.

The above-described properties, features and advantages and the way in which they are achieved will become clearer and more clearly understood in association with the following description of examples explained in greater detail in association with the drawings.

FIG. 1 shows a highly schematic plan view of a video wall module 100. The video wall module 100 is illustrated incompletely and in a simplified manner in FIG. 1 to illustrate the fundamental geometry of the video wall module 100.

The video wall module 100 may serve as a module to construct a larger video wall. In this case, the video wall may comprise a multiplicity of video wall modules 100 of identical type. The video wall may serve to display static or moving, mono- or polychromatic pictures.

The video wall module 100 comprises a plurality of pixels 110, arranged in a regular, two-dimensional rectangular grid 120. In the example shown in FIG. 1, the rectangular grid 120 comprises 16 columns 122 and 16 rows 121. The video wall module 100 thus comprises 16×16 pixels 110. However, it is possible to configure the video wall module 100 with a different number of pixels 110, for example, with 8×8 pixels 110, with 4×4 pixels 110 or with 32×32 pixels 110. It is likewise possible for the number of rows 121 of the rectangular grid 120 of the video wall module 100 to differ from the number of columns 122 of the rectangular grid 120. In this case, the video wall module 100 may comprise, for example, 8×16 pixels 110.

The pixels 110 of the video wall module 100 are configured in a square fashion in the example shown in FIG. 1. Since the rectangular grid 120 is also square in the example shown in FIG. 1, the video wall module 100 overall comprises a square shape. However, the pixels 110 might also be configured in a rectangular fashion. In this case, the video wall module 100 may comprise a non-square rectangular shape. It is likewise possible to configure the pixels 110 with a non-square rectangular shape and to configure the rectangular grid 120 with a different number of rows 121 and columns 122 such that the video wall module 100 overall comprises a square shape.

2×2 adjacent pixels 110 of the rectangular grid 120 respectively form a block 130 of associated pixels 110. In the example shown in FIG. 1, the rectangular grid 120 of the video wall module 100 thus comprises 8×8 blocks 130.

The individual pixels 110 of the video wall module 100 may comprise an edge length which is, for example, 0.3 mm to 2 mm, in particular, for example, 0.5 mm to 1 mm. If the pixels 110 are configured in a square fashion, then they may thus comprise, for example, a size of 1 mm×1 mm. In this case, the video wall module 100 may comprise, for example, an edge length of 16 mm. It may be expedient for the video wall module 100 to comprise a somewhat smaller edge length to compensate for tolerances, for example, an edge length of 15.9 mm.

Each pixel 110 of the video wall module 100 comprises three light emitting diode chips (LED chips) 200 in the example shown in FIG. 1. The three light emitting diode chips 200 of a pixel 110 may be configured to emit light of different colors. By way of example, the three light emitting diode chips 200 of a pixel 110 may be configured to emit red, green and blue light. By additive mixing of the radiation emitted by the light emitting diode chips 200 of a pixel 110, each pixel 110 is enabled to emit light with a color that is adjustable within wide limits.

However, it is also possible to configure the video wall module 100 with a different number of light emitting diode chips 200 per pixel 110. By way of example, each pixel 110 of the video wall module 100 may comprise one light emitting diode chip 200, two light emitting diode chips 200 or more than three light emitting diode chips 200. In this case, the light emitting diode chips 200 may be configured, for example, to emit blue, green, yellow, red or orange light.

In the example shown in FIG. 1, the individual light emitting diode chips 200 of a pixel 110 are arranged linearly alongside one another. In this case, the light emitting diode chips 200 are arranged in rows such that all the light emitting diode chips 200 of all the pixels 110 of a row 121 of the rectangular grid 120 of the video wall module 100 are arranged in a common row. However, it is likewise possible to arrange the light emitting diode chips 200 of a pixel 110 linearly alongside one another in columns such that all the light emitting diode chips 200 of all the pixels 110 of a column 122 of the rectangular grid 120 of the video wall module 100 are arranged in a common column. It is likewise possible to arrange the individual light emitting diode chips 200 of a pixel 110 alongside one another in a different way than linearly, for example, in a triangular arrangement or a vertically offset arrangement. A linear arrangement of the individual light emitting diode chips 200 of a pixel 110 of the video wall module 100 may afford advantages in the picture quality achievable by the video wall module 100.

The individual light emitting diode chips 200 of a pixel 110 may comprise, for example, a spacing (light emitting diode chip-to-light emitting diode chip spacing) of 30 μm to 60 μm. In this case, the individual light emitting diode chips 200 may comprise, for example, edge lengths that are 0.1 mm to 0.5 mm.

Figure 2:
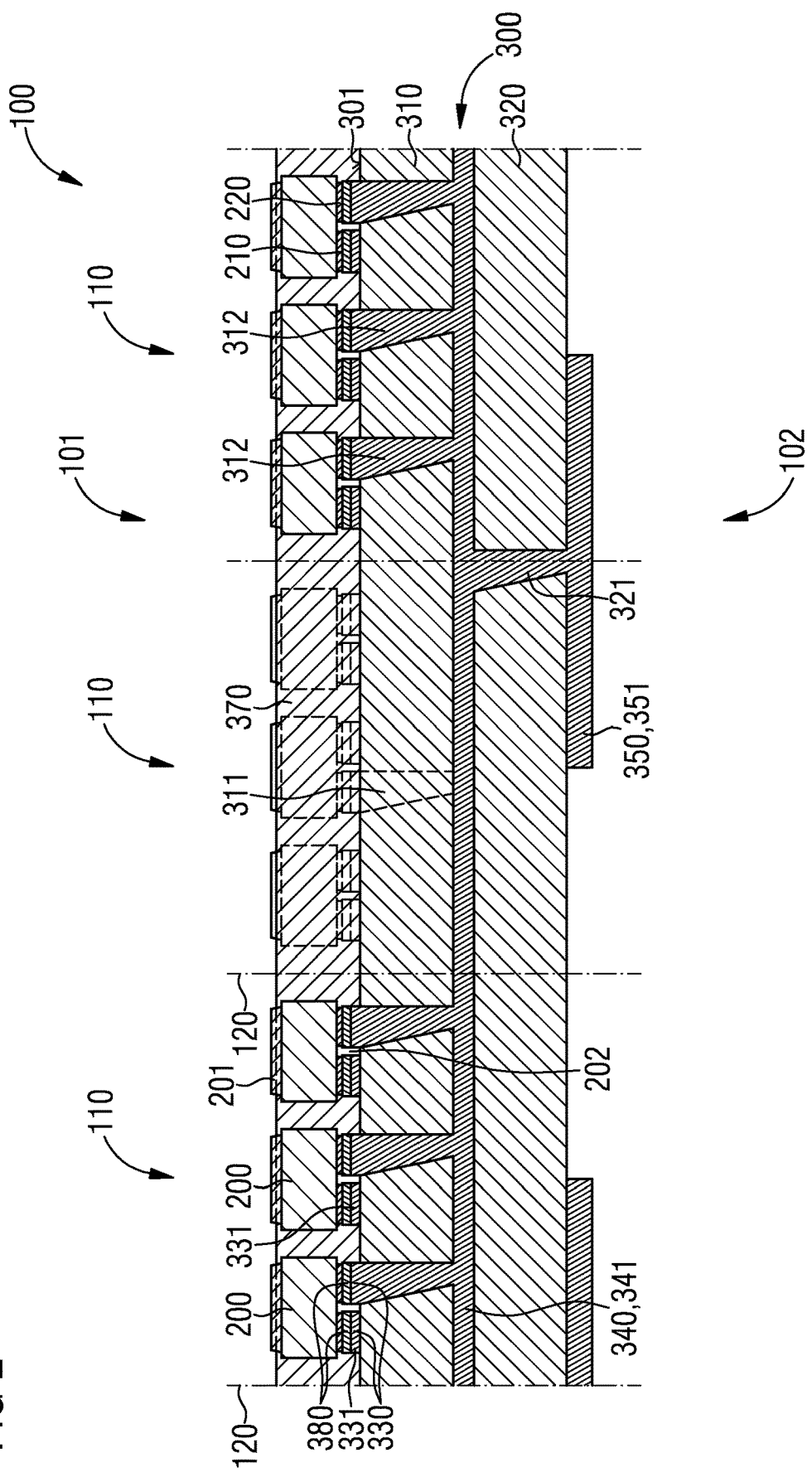
FIG. 2 schematically shows a sectional side view of a part of a video wall module in accordance with a first example.

FIG. 2 shows a schematic sectional side view of a part of the video wall module 100. The course of the sectional edge is depicted in FIG. 1.

Each of the light emitting diode chips 200 comprises a radiation emission side 201 and a contact side 202 opposite the radiation emission side 201. The light emitting diode chips 200 may be configured as flip-chips. The light emitting diode chips 200 are each configured to emit electromagnetic radiation at their radiation emission side 201.

Each of a first contact electrode 210 and a second contact electrode 220 are arranged at the contact side 202 of each light emitting diode chip 200. The first contact electrode 210 may be, for example, an anode of the respective light emitting diode chip 200. In this case, the second contact electrode 220 forms a cathode of the respective light emitting diode chip 200. However, it is also possible for the first contact electrode 210 to form a cathode and the second contact electrode 220 to form an anode of the light emitting diode chip 200. Both the first contact electrode 210 and the second contact electrode 220 may be subdivided into a plurality of partial electrodes arranged at different positions of the contact side 202 in particular, for example, in an interlaced arrangement.

The light emitting diode chips 200 of the video wall module 100 are arranged at a top side 301 of a multilayer circuit board 300. The circuit board 300 may also be referred to as a printed circuit board (PCB). The light emitting diode chips 200 are arranged at the top side 301 of the circuit board 300 such that the contact sides 202 of the light emitting diode chips 200 face the top side 301 of the circuit board 300 and the radiation emission sides 201 of the light emitting diode chips 200 face away from the top side 301 of the circuit board 300.

In the example shown in FIG. 2, the multilayer circuit board 300 comprises a first circuit board layer 310 and a second circuit board layer 320. The first circuit board layer 310 is arranged above the second circuit board layer 320 such that the first circuit board layer 310 is arranged closer to the light emitting diode chips 200 than the second circuit board layer 320.

A first metallization layer 330 is arranged at the top side of the first circuit board layer 310 facing the light emitting diode chips 200, the first metallization layer together with the top side of the first circuit board layer 310 forming the top side 301 of the circuit board 300. A second metallization layer 340 is arranged between the first circuit board layer 310 and the second circuit board layer 320. A third metallization layer 350 is arranged at the underside of the second circuit board layer 320 facing away from the first circuit board layer 310. The underside of the second circuit board layer 320 and the third metallization layer 350 form a rear side 102 of the video wall module 100.

Sections of the first metallization layer 330 and sections of the second metallization layer 340 electrically conductively connect to one another via first upper through contacts 311 arranged in the first circuit board layer 310 and second upper through contacts 312 arranged in the first circuit board layer 310. Sections of the second metallization layer 340 and sections of the third metallization layer 350 electrically conductively connect to one another via lower through contacts 321 arranged in the second circuit board layer 320 of the circuit board 300.

Figure 3:
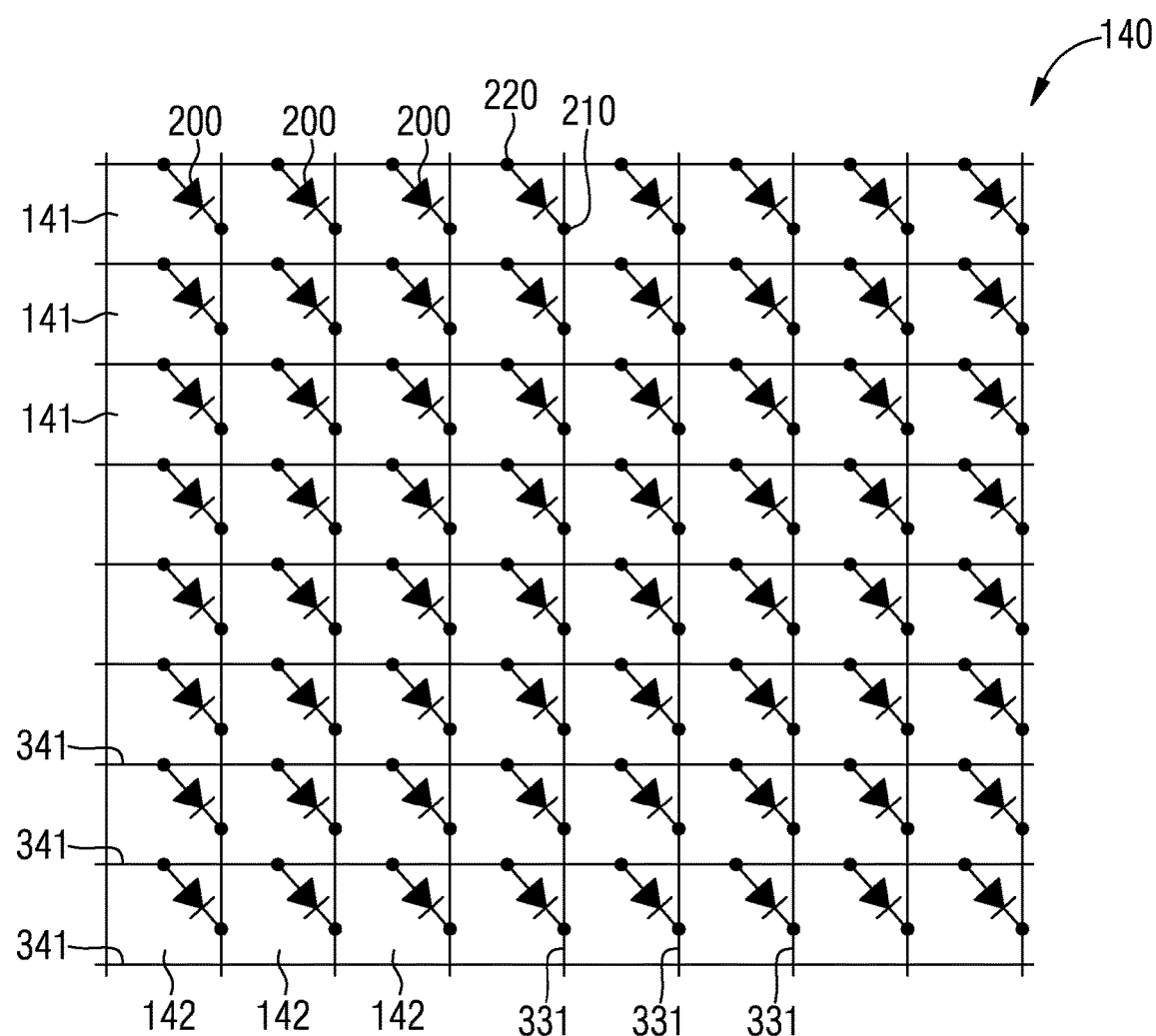
FIG. 3 schematically shows a circuit diagram of a cross-matrix interconnection of a video wall module.

The metallization layers 330, 340, 350 of the circuit board 300 of the video wall module 100 form a cross-matrix interconnection 140, an excerpt from which is illustrated schematically in FIG. 3. The light emitting diode chips 200 of a logical matrix comprising logical rows 141 and logical columns 142 are arranged in the cross-matrix interconnection 140. One of the light emitting diode chips 200 is arranged at each crossover of a logical row 141 and a logical column 142.

In the simplest case, the logical rows 141 of the cross-matrix interconnection 140 coincide with the rows 121 of the rectangular grid 120 of the pixels 110 of the video wall module 100. The logical columns 142 of the cross-matrix interconnection 140 extend like the columns 122 of the rectangular grid 120 of pixels 110, although, in the illustrated example of three light emitting diode chips 200 per pixel 110, three logical columns 142 are present per column 122 of the rectangular grid 120 of pixels 110.

In the cross-matrix interconnection 140, the first contact electrodes 210 of each logical column 142 of light emitting diode chips 200 electrically conductively connect to one another by a column line 331. The number of column lines 331 thus corresponds to the number of logical columns 142 of the cross-matrix interconnection 140. The second contact electrodes 220 of the light emitting diode chips 200 of each logical row 141 of the cross-matrix interconnection 140 electrically conductively connect to one another in each case by a row line 341. The number of row lines 341 thus corresponds to the number of logical rows 141 of the cross-matrix interconnection 140.

The cross-matrix interconnection 140 makes it possible for all the light emitting diode chips 200 of a logical row 141 to be simultaneously driven independently of one another. The light emitting diode chips 200 of all the other logical rows 141 are not driven during this time. The individual logical rows 141 of the cross-matrix interconnection 140 may be driven temporally successively (multiplexing method) so that all the light emitting diode chips 200 arranged in the cross-matrix interconnection 140 are addressed independently of one another in this way.

Figure 4:
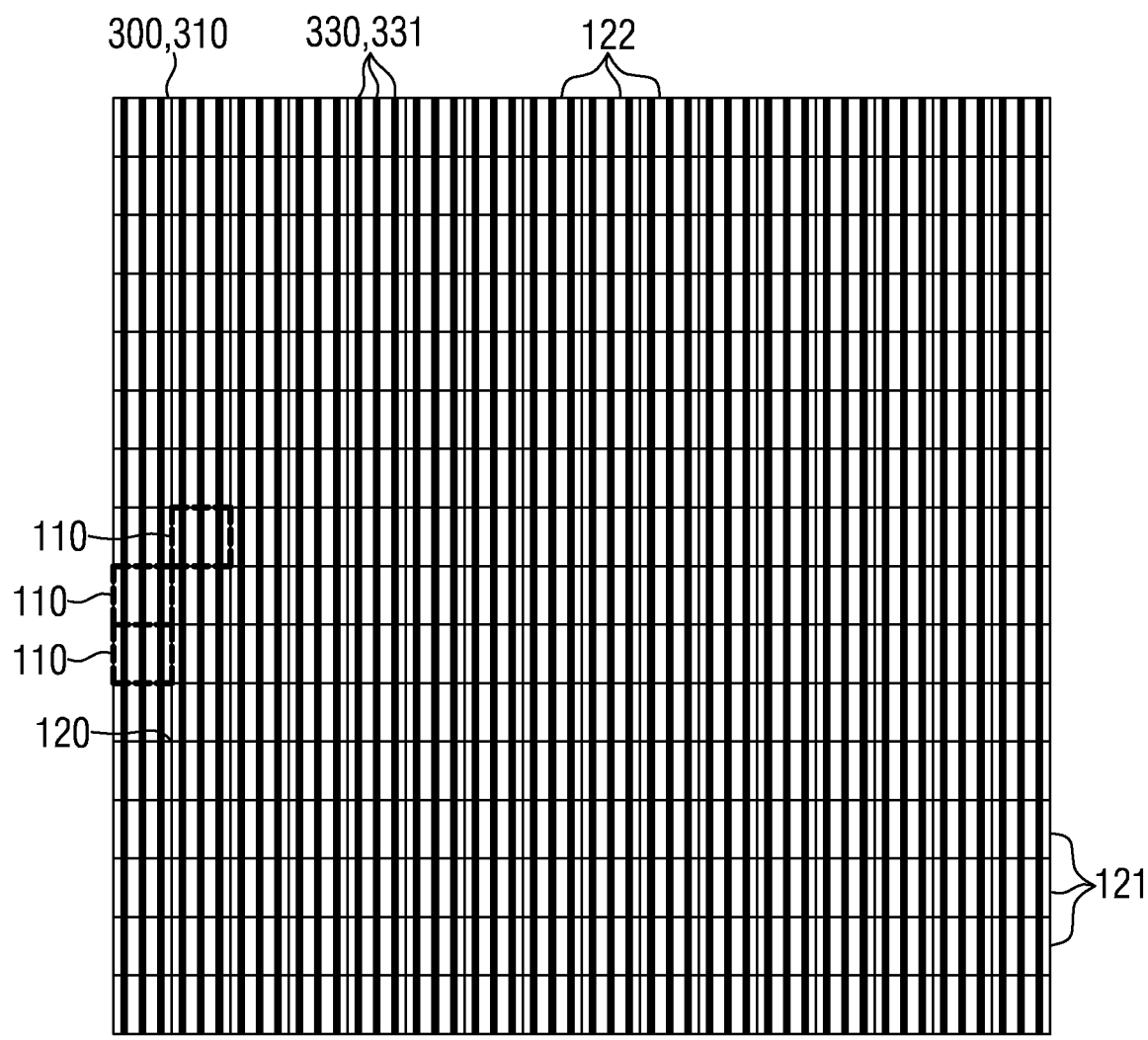
FIG. 4 schematically shows a plan view of a first metallization layer of a circuit board of the video wall module.

FIG. 4 shows, in a schematic illustration, a plan view of the first metallization layer 330 arranged at the top side of the first circuit board layer 310 of the circuit board 300 of the video wall module 100. For the sake of easier understanding, the rectangular grid 120 of the pixels 110 of the video wall module 100 is additionally depicted in FIG. 4. This also applies to FIGS. 5, 6, 7 and 8 described below.

The first metallization layer 330 forms the column lines 331 of the cross-matrix interconnection 140. The column lines 331 extend parallel to the columns 122 of the rectangular grid 120 of pixels 110. Three column lines 331 are present per column 122 of pixels 110. The light emitting diode chips 200 are arranged at the top side 301 of the circuit board 300 such that the first contact electrode 210 of each light emitting diode chip 200 electrically conductively connects to a column line 331. The individual column lines 331 are electrically insulated from one another.

Figure 5:
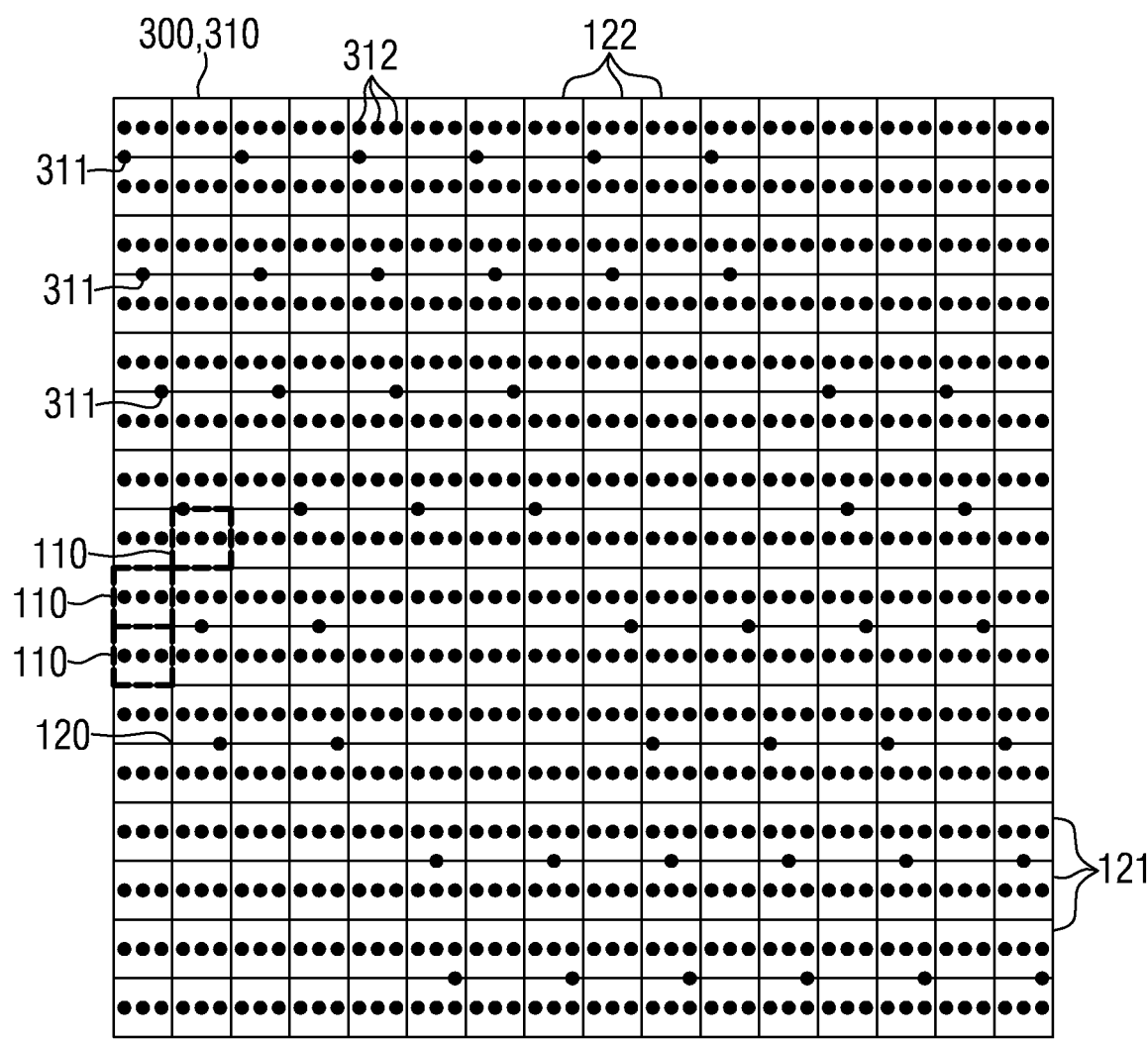
FIG. 5 schematically shows a plan view of upper through contacts of the circuit board of the video wall module.

FIG. 5 shows, in a schematic illustration, the arrangement of the first upper through contacts 311 and second upper through contacts 312 arranged in the first circuit board layer 310 of the circuit board 300 of the video wall module 100.

The circuit board 300 comprises one first upper through contact 311 per column line 331, that is to say per logical column 142 of the cross-matrix interconnection 140. Each column line 331 electrically conductively connects to a first upper through contact 311. In the example shown in FIG. 5, the first upper through contacts 311 are arranged at the boundaries between the rows 121 of pixels 110. However, it is possible to arrange the first upper through contacts 311 at other positions.

The circuit board 300 additionally comprises one second upper through contact 312 per light emitting diode chip 200 of the video wall module 100, that is to say three second upper through contacts 312 per pixel 110 in the example of the video wall module 100 comprising three light emitting diode chips 200 per pixel 110. The light emitting diode chips 200 are arranged at the top side 301 of the circuit board 300 such that the second contact electrode 220 of each light emitting diode chip 200 electrically conductively connects to one of the second upper through contacts 312. The first metallization layer 330 at the top side of the first circuit board layer 310 may comprise metal sections, not illustrated in FIG. 4, that produce electrically conductive connections between the second contact electrodes 220 of the light emitting diode chips 200 and the second upper through contacts 312.

Figure 6:
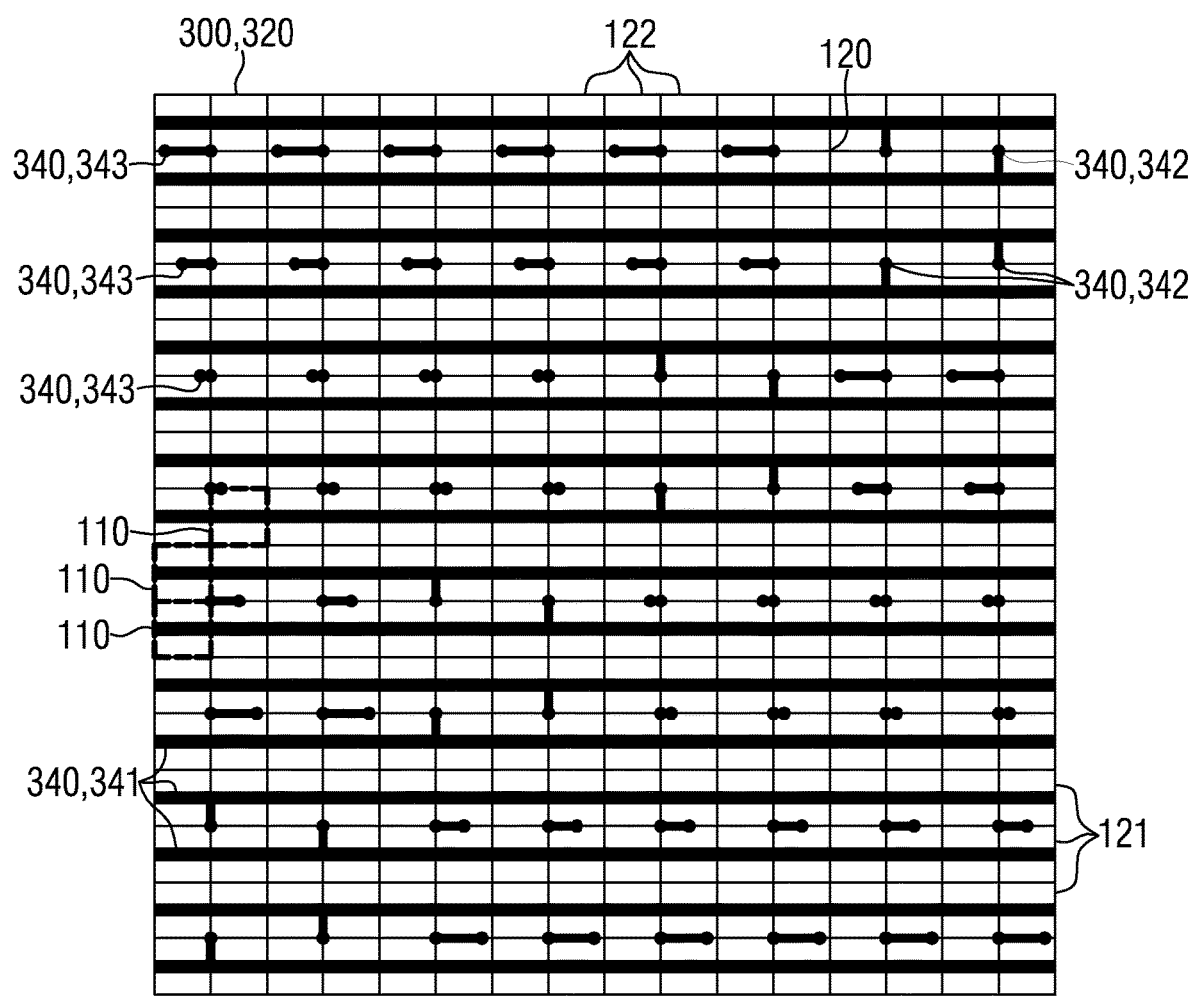
FIG. 6 schematically shows a plan view of a second metallization layer of the circuit board of the video wall module.

FIG. 6 shows, in a schematic illustration, a plan view of the second metallization layer 340 arranged between the first circuit board layer 310 and the second circuit board layer 320 of the circuit board 300 of the video wall module 100.

The second metallization layer 340 forms the row lines 341 of the cross-matrix interconnection 140. The row lines 341 extend parallel to the rows 121 of the rectangular grid 120 of the pixels 110. One row line 341 is present per row 121 of pixels 110.

The rows lines 341 of the second metallization layer 340 are arranged such that the second contact electrodes 220 of all the light emitting diode chips 200 of a row 121 of pixels 110 each electrically conductively connect to a common row line 341 via the second upper through contacts 312. Each row line 341 thus electrically short-circuits the second contact electrodes 220 of all the light emitting diode chips 200 of a row 121 of pixels 110 of the video wall module 100. The individual row lines 341 are electrically insulated from one another.

In addition to the row lines 341, the second metallization layer 340 comprises row connection structures 342 and column connection structures 343. The row connection structures 342 and the column connection structures 343 are each arranged between the row lines 341. The row connection structures 342 electrically conductively connect to the row lines 341. In this case, each row line 341 connects to a row connection structure 342 and each row connection structure 342 connects to a row line 341. The column connection structures 343 are electrically insulated from one another, from the row lines 341 and from the row connection structures 342.

Each column connection structure 343 of the second metallization layer 340 illustrated in FIG. 6 electrically conductively connects to exactly one of the first upper through contacts 311 shown in FIG. 5 in the first circuit board layer 310. As a result, each column connection structure 343 of the second metallization layer 340 electrically conductively connects to exactly one column line 331 of the first metallization layer 330 shown in FIG. 4. The number of column connection structures 343 corresponds to the number of column lines 331.

Figure 7:
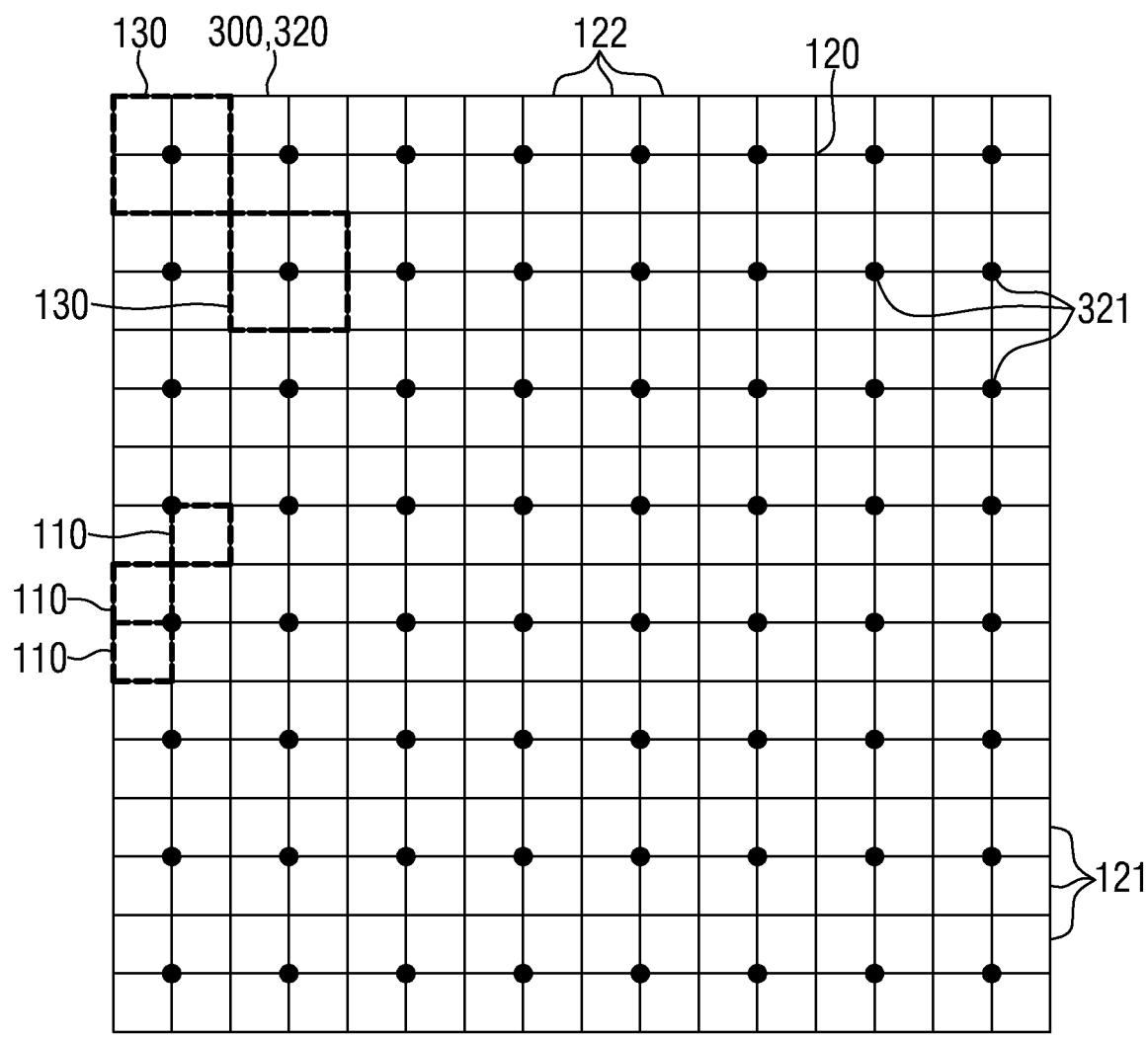
FIG. 7 schematically shows a plan view of lower through contacts of the circuit board of the video wall module.

FIG. 7 shows, in a schematic illustration, the arrangement of the lower through contacts 321 arranged in the second circuit board layer 320 of the circuit board 300 of the video wall module 100. The number of lower through contacts 321 corresponds to the number of blocks 330 of pixels 110 of the video wall module 100. One lower through contact 321 is provided per block 130. In the illustrated example here the lower through contact 321 is each arranged at the point at which the four pixels 110 forming the respective block 130 meet. However, it is possible to arrange the lower through contacts 321 at other positions.

Each row connection structure 342 and each column connection structure 343 of the second metallization layer 340 illustrated in FIG. 6 electrically conductively connects to exactly one of the lower through contacts 321 illustrated in FIG. 7. Each lower through contact 321 electrically conductively connects to exactly one row connection structure 342 or exactly one column connection structure 343. In this case, the row connection structures 342 produce connections between the row lines 341 and the positions of the lower through contacts 321 assigned to the row lines 341. The column connection structures 343 produce connections between the positions of the first upper through contacts 311 and the positions of the respectively assigned lower through contacts 321.

Figure 8:
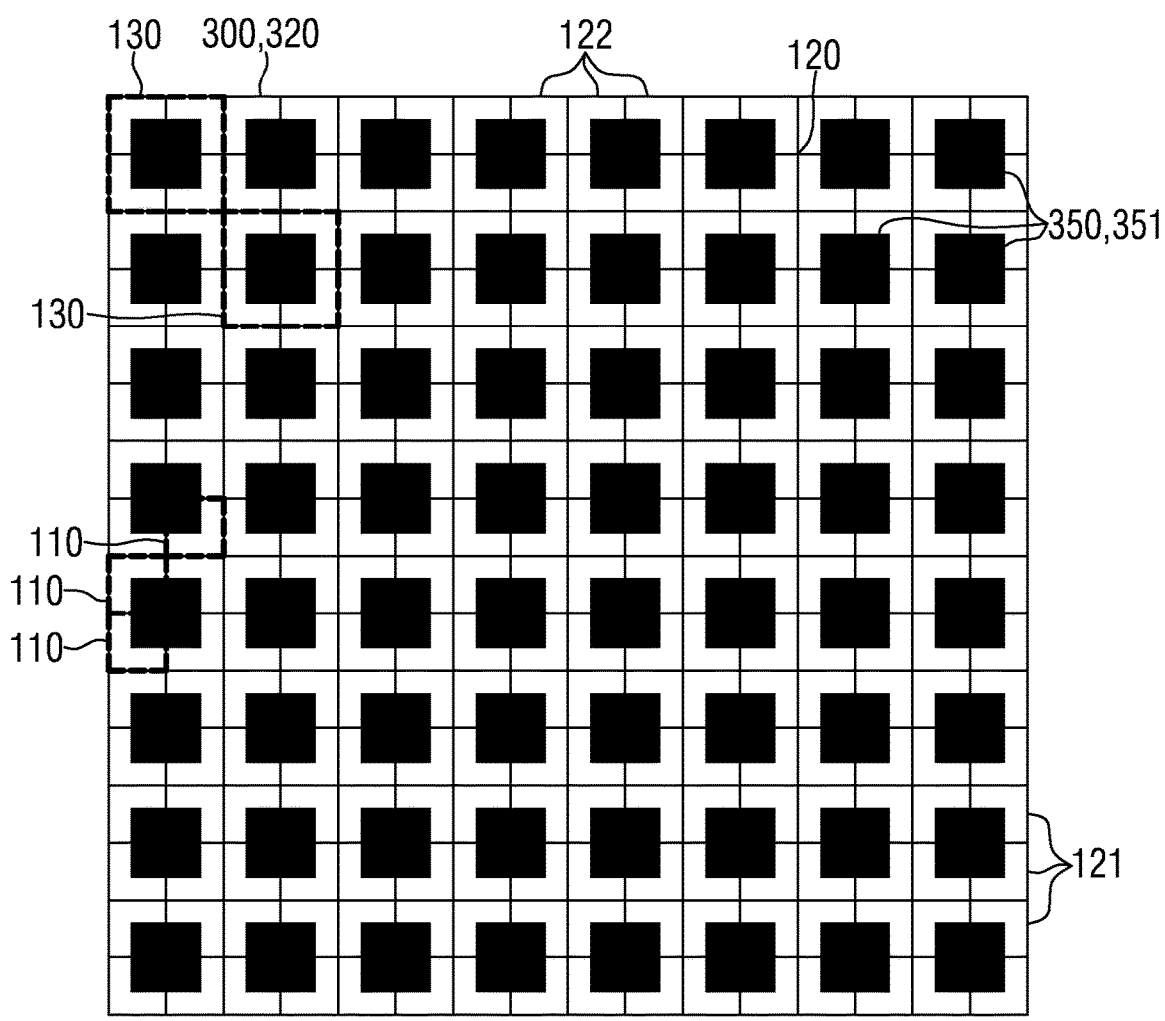
FIG. 8 schematically shows a plan view of a third metallization layer of the circuit board of the video wall module.

FIG. 8 shows, in a schematic illustration, a view of the third metallization layer 350 arranged at the underside of the second circuit board layer 320 of the circuit board 300 of the video wall module 100. Electrical contact pads 351 of the video wall module 100 are formed in the third metallization layer 350. The electrical contact pads 351 may serve as external contact pads of the video wall module 100 to electrically contact the video wall module 100. The video wall module 100 may be provided, for example, for surface mounting (SMT mounting), for example, for surface mounting by reflow soldering.

The number of electrical contact pads 351 formed in the third metallization layer 350 corresponds to the number of lower through contacts 321 arranged in the second circuit board layer 320 of the circuit board 300 and thus also to the number of blocks 130 of pixels 110 of the video wall module 100. Each lower through contact 321 is assigned an electrical contact pad 351 in the third metallization layer 350. In this case, like the associated lower through contact 321, the respective electrical contact pad 351 is centered at the crossover point of the four pixels 110 forming a block 130 of the video wall module 100. In the illustrated example, the electrical contact pads 351 each comprise a square shape, but might, for example, also each comprise a circular disk shape or some other shape.

Each electrical contact pad 351 formed in the third metallization layer 350 electrically conductively connects to the lower through contact 321 assigned to it in the second circuit board layer 320 of the circuit board 300. Consequently, via the first upper through contacts 311 in the first circuit board layer 310, the column connection structures 343 in the second metallization layer 340 and the lower through contacts 321 in the second circuit board layer 320, each column line 331 of the first metallization layer 330 electrically conductively connects to exactly one electrical contact pad 351 in the third metallization layer 350. In addition, via the row connection structures 342 of the second metallization layer 340 and the lower through contacts 321 in the second circuit board layer 320, each row line 341 of the second metallization layer 340 electrically conductively connects to exactly one electrical contact pad 351 of the third metallization layer 350. The electrical contact pads 351 of the video wall module 100 thus allow all the light emitting diode chips 200 of the video wall module 100 to be electrically driven via the cross-matrix interconnection 140 formed in the circuit board 300.

The circuit board 300 of the video wall module 100 may be preproduced with the first circuit board layer 310, the second circuit board layer 320, the first metallization layer 330, the upper through contacts 311, 212, the second metallization layer 340, the lower through contacts 321 and the third metallization layer 350.

Afterward, the preproduced light emitting diode chips 200 are arranged at the top side 301 of the circuit board 300, wherein the contact electrodes 210, 220 electrically conductively connect to the first metallization layer 330 of the circuit board 300.

The contact electrodes 210, 220 of the light emitting diode chips 200 may comprise small distances from one another at the contact sides 202 of the light emitting diode chips 200. This may result in a risk of the first contact electrodes 210 and the second contact electrodes 220 being electrically short-circuited during production of the electrically conductive connections to the first metallization layer 330 of the circuit board 300.

Figure 9:
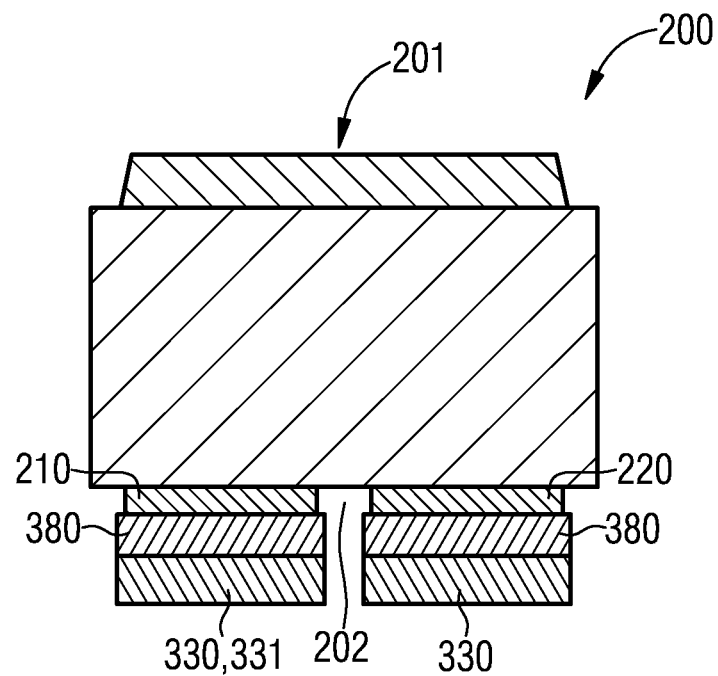
FIG. 9 schematically shows a sectional side view of a light emitting diode chip contacted by a conductive die attach film.

To reduce the risk of a short circuit between the first contact electrodes 210 and the second contact electrodes 220 of the light emitting diode chips 200, at the contact side 202 of each light emitting diode chip 200 there may be arranged a patterned section of a conductive die attach film 380 that electrically conductively connects the contact electrodes 210, 220 of the light emitting diode chip 200 to the first metallization layer 330. For this purpose, the section of the conductive die attach film 380 is first arranged in a planar fashion at the contact side 202 of the respective light emitting diode chip 200 and subsequently patterned such that parts of the conductive die attach film 380 in contact with the first contact electrode 210 and the second contact electrode 220 are electrically isolated from one another. Patterning the conductive die attach film 380 may be carried out by a laser, for example. FIG. 9 shows a schematic sectional side view of a light emitting diode chip 200 comprising a section of a conductive die attach film 380 that has been correspondingly patterned, the section being arranged at the contact side 202 of the light emitting diode chip 200.

Afterward, each light emitting diode chip 200 is arranged at the top side 301 of the circuit board 300 such that the respective section of the conductive die attach film 380 electrically conductively connects the contact electrodes 210, 220 of the respective light emitting diode chip 200 to the first metallization layer 330.

The light emitting diode chips 200 may be produced in a wafer assemblage. In this case, a chip wafer comprises a plurality of integrally continuous light emitting diode chips 200, which are singulated only toward the end of the production process by dividing the chip wafer. The conductive die attach film 380 may be arranged on the chip wafer comprising a plurality of light emitting diode chips 200, as early as in the wafer assemblage. Patterning the conductive die attach film 380 is then likewise carried out in the wafer assemblage before the light emitting diode chips 200 are actually singulated. The conductive die attach film 380 is divided together with the chip wafer during the process of singulating the light emitting diode chips 200.

An alternative possibility of reducing the risk of a short circuit between the contact electrodes 210, 220 of the light emitting diode chips 200 consists in the use of an anisotropically conductive film 390 arranged at the top side 301 of the circuit board 300 to electrically conductively connect the contact electrodes 210, 220 of the light emitting diode chips 200 to the first metallization layer 330.

Figure 10:
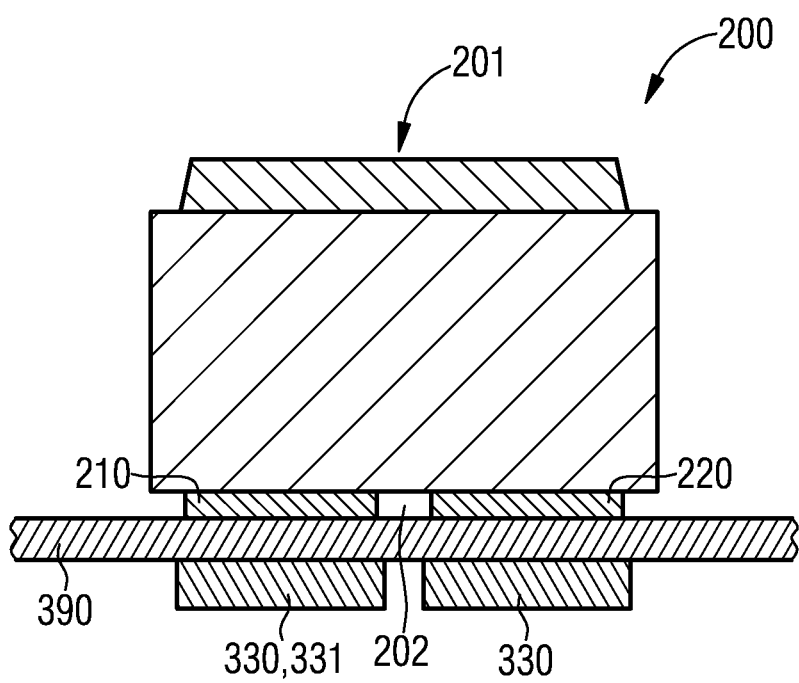
FIG. 10 schematically shows a sectional side view of a light emitting diode chip contacted by an anisotropically conductive film.

FIG. 10 shows a schematic sectional side view of a light emitting diode chip 200 comprising a section of the anisotropically conductive film 390 arranged between the contact electrodes 210, 220 at the contact side 202 of the light emitting diode chip 200 and the first metallization layer 330 at the top side 301 of the circuit board 300. The anisotropically conductive film 390 is first arranged in a planar fashion at the top side 301 of the circuit board 300. Afterward, the light emitting diode chips 200 are arranged at the top side 301 of the circuit board 300 such that the anisotropically conductive film 390 electrically conductively connects the contact electrodes 210, 220 of the light emitting diode chip 200 to the first metallization layer 330. This makes use of the fact that the anisotropically conductive film 390 is electrically conductive only in a direction perpendicular to the plane of the anisotropically conductive film 390, that is to say in a direction perpendicular to the top side 301 of the circuit board 300, but not in a lateral direction within the plane of the anisotropically conductive film 390, that is to say parallel to the top side 301 of the circuit board 300. This anisotropic conductivity of the anisotropically conductive film 390 may be brought about or amplified by a pressure exerted locally on the anisotropically conductive film 390 by the contact electrodes 210, 220 of the light emitting diode chips 200.

A further alternative possibility to secure and contact the light emitting diode chips 200 at the top side 301 of the circuit board 300 such that there is only a small risk of a short circuit between the contact electrodes 210, 220 of the light emitting diode chips 200 is illustrated schematically in FIG. 12. In this variant, the light emitting diode chips 200 are secured to the top side 301 of the circuit board 300 by an electrically insulating adhesive 395. The electrically insulating adhesive 395 may be applied on the top side 301 of the circuit board 300 in a planar fashion, for example, before the process of arranging the light emitting diode chips 200. FIG. 12 shows a schematic sectional side view of a light emitting diode chip 200 comprising a section of the electrically insulating adhesive 395 arranged between the contact side 202 of the light emitting diode chip 200 and the top side 301 of the circuit board 300.

In this variant, the contact electrodes 210, 220 of the light emitting diode chips 200 and/or the first metallization layer 330 comprise microscopic metal tips 211, 221, 332, which locally pierce the electrically insulating adhesive 395 during the process of placing the light emitting diode chips 200 onto the top side 301 of the circuit board 300 and thereby produce electrically conductive connections between the contact electrodes 210, 220 of the light emitting diode chips 200 and the first metallization layer 330.

After the process of arranging the light emitting diode chips 200 at the top side 301 of the circuit board 300, a potting material 370 may be arranged at the top side 301 of the circuit board 300, wherein the light emitting diode chips 200 are partly embedded into the potting material 370. FIG. 2 shows the potting material 370 arranged at the top side 301 of the circuit board 300. The light emitting diode chips 200 are embedded into the potting material 370 such that side faces of the light emitting diode chips 200 extending between the radiation emission sides 201 and the contact sides 202 are covered by the potting material 370, but the radiation emission sides 201 of the light emitting diode chips 200 are not covered by the potting material 370. The potting material 370 may terminate flush with the radiation emission sides 201 of the light emitting diode chips 200. The potting material 370 arranged above the top side 301 of the circuit board 300 and the radiation emission sides 201 of the light emitting diode chips 200, the radiation emission sides not being covered by the potting material 370, form a front side 101 of the video wall module 100.

The potting material 370 may afford protection of the light emitting diode chips 200 against damage as a result of external influences. At the same time, the potting material 370 may bring about a uniform appearance of the front side 101 of the video wall module 100. The potting material 370 may comprise a high or a low optical reflectivity, depending on the application. If the potting material 370 comprises a black color comprising a low optical reflectivity, then this may result in a particularly high contrast between the radiation emission sides 201 of radiation-emitting light emitting diode chips 200 and other sections of the front side 101 of the video wall module 100.

The potting material 370 may comprise, for example, a plastics material, for example, an epoxy or a silicone. The potting material 370 may be arranged at the top side 301 of the circuit board 300, for example, by a molding method (mold method). The potting material 370 may be omitted in a simplified example.

Figure 11:
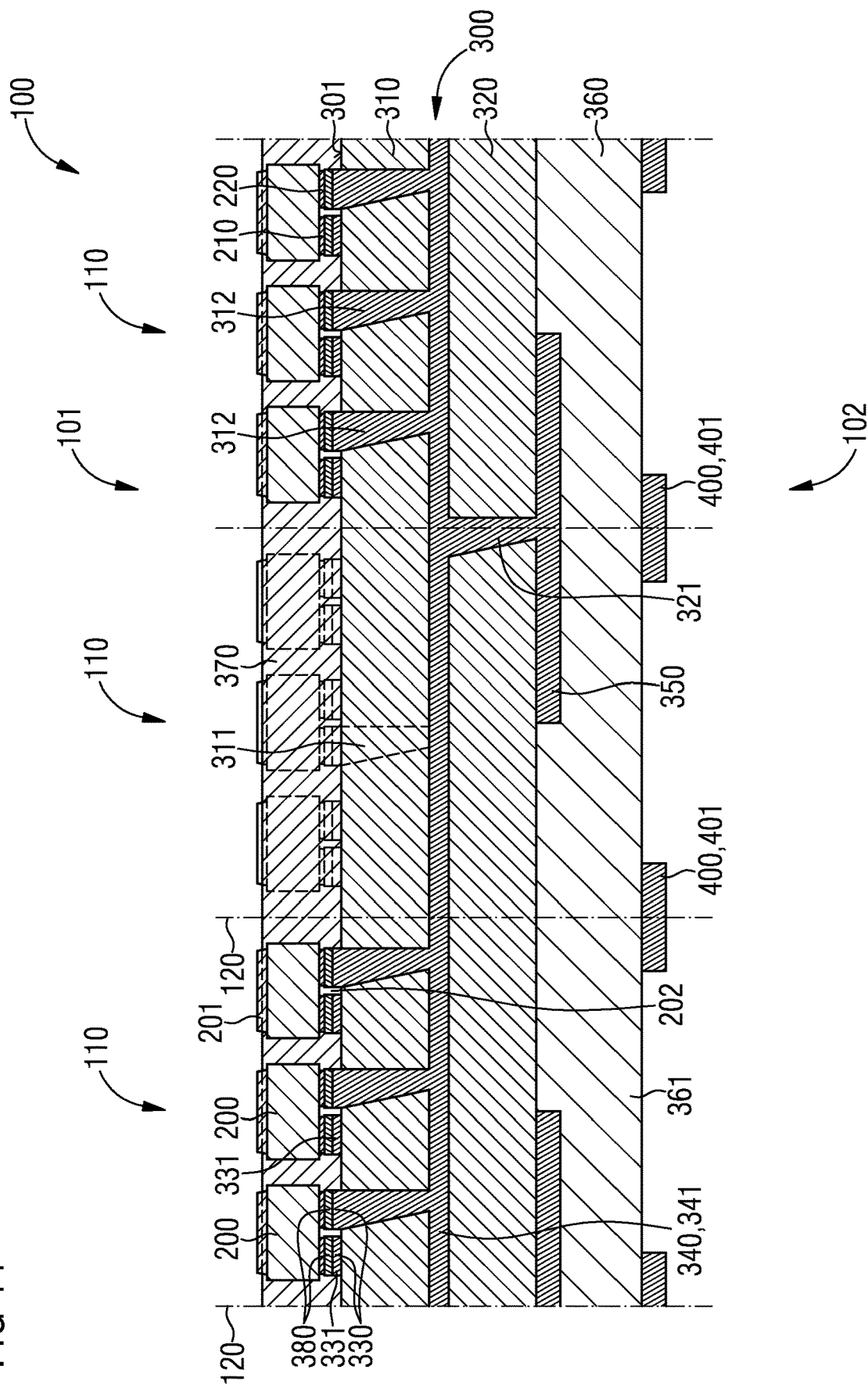
FIG. 11 schematically shows a sectional side view of a part of a video wall module in accordance with a second example.

FIG. 11 shows, in a schematic sectional side view, a part of the video wall module 100 in accordance with a further example. The section in the illustration in FIG. 11 extends exactly in the same way as in the illustration in FIG. 2. The example of the video wall module 100 as shown in FIG. 11 largely corresponds to the example of the video wall module 100 as shown in FIG. 2. Mutually corresponding component parts are provided with the same reference signs in FIGS. 2 and 11. Only the differences between the examples shown in FIGS. 2 and 11 are described below.

In the example of the video wall module 100 as shown in FIG. 11, the multilayer circuit board 300 comprises a third circuit board layer 360 besides the first circuit board layer 310 and the second circuit board layer 320. In this case, the second circuit board layer 320 is arranged between the first circuit board layer 310 and the third circuit board layer 360. The third metallization layer 350 of the circuit board 300 is arranged between the second circuit board layer 320 and the third circuit board layer 360.

A fourth metallization layer 400 is arranged at the underside of the third circuit board layer 360 of the circuit board 300 facing away from the second circuit board layer 320. The fourth metallization layer 400 forms the rear side 102 of the video wall module 100. Electrical contact pads 401 are formed in the fourth metallization layer 400 and, in the example of the video wall module 100 shown in FIG. 11, form external electrical contact pads of the video wall module 100 to electrically contact the video wall module 100. The example of the video wall module 100 shown in FIG. 11 may also be suitable as an SMT component for surface mounting, for example, for surface mounting by reflow soldering.

Through contacts may be arranged in the third circuit board layer 360, the through contacts electrically conductively connecting sections of the third metallization layer 350 to sections of the fourth metallization layer 400. In addition, at least one electronic component 361 is arranged in the third circuit board layer 360. It is also possible for a plurality of electronic components 361 to be arranged in the third circuit board layer 360. The electronic components 361 may be active or passive electronic components, for example, resistors, capacitors, transistors, electronic semiconductor chips or other electronic components. The electronic components 361 electrically conductively connect to the electrical contact pads 351 of the third metallization layer 350 and the electrical contact pads 401 formed in the fourth metallization layer 400.

The electronic components 361 arranged in the third circuit board layer 360 may, for example, drive the light emitting diode chips 200 via the cross-matrix interconnection 140 in the multiplexing method. Consequently, in the example of the video wall module 100 shown in FIG. 11, at least a portion of the electronics required to drive the light emitting diode chips 200 is integrated into the video wall module 100. As a result, the example of the video wall module 100 shown in FIG. 11 may be driven particularly easily.

In further examples of the video wall module 100, the multilayer circuit board 300 is configured differently from in the examples shown in FIGS. 2 and 11. By way of example, the circuit board 300 may comprise a different interconnection than the cross-matrix interconnection 140. In any case, however, the circuit board 300 is configured in a multilayer fashion and comprises at its top side 301 the first metallization layer 330, to which the contact electrodes 210, 220 of the light emitting diode chips 200 arranged at the top side 301 of the circuit board 300 are electrically conductively connected.

My modules and methods have been illustrated and described in greater detail on the basis of preferred examples. Nevertheless, this disclosure is not restricted to the examples disclosed. Rather, other variations may be derived therefrom by those skilled in the art, without departing from the scope of protection of the appended claims.

This application claims priority of DE 10 2016 103 324.3, the subject matter of which is incorporated herein by reference.

The invention claimed is:

1. A video wall module comprising a plurality of light emitting diode chips,
    each comprising first contact electrodes and second contact electrodes arranged at a contact side,
    wherein the light emitting diode chips are arranged at a top side of a multilayer circuit board,
    the first and second contact electrodes electrically conductively connect to a first metallization layer arranged at the top side of the circuit board, and
    the first contact electrode is an anode of the light emitting diode chip and the second contact electrode is a cathode of the light emitting diode chip or the first contact electrode is a cathode and the second contact electrode is an anode,
    the circuit board comprises a second metallization layer, and
    sections of the first metallization layer and sections of the second metallization layer electrically conductively connect to one another by through contacts arranged in the circuit board,
    the circuit board comprises a third metallization layer, and
    sections of the second metallization layer and sections of the third metallization layer electrically conductively connect to one another by through contacts arranged in the circuit board.

2. The video wall module according to claim 1, wherein at the contact side of each light emitting diode chip there is arranged a patterned section of a conductive die attach film that electrically conductively connects the first and second contact electrodes of the light emitting diode chip to the first metallization layer.

3. The video wall module according to claim 1, wherein an anisotropically conductive film is arranged at the top side of the circuit board, said anisotropically conductive film electrically conductively connecting the contact electrodes of the light emitting diode chips to the first metallization layer.

4. The video wall module according to claim 1, wherein the light emitting diode chips are at least partly embedded into a potting material arranged at the top side of the circuit board.

5. The video wall module according to claim 1, wherein the light emitting diode chips are logically distributed among rows and columns of a matrix, the first contact electrodes of the light emitting diode chips electrically conductively connect to one another column by column by the first metallization layer, and the second contact electrodes of the light emitting diode chips electrically conductively connect to one another row by row by the second metallization layer.

6. The video wall module according to claim 1, wherein the third metallization layer forms external electrical contact pads of the video wall module.

7. The video wall module according to claim 1, wherein the circuit board comprises integrated electronic components.

8. The video wall module according to claim 1, wherein two or three adjacent light emitting diode chips respectively form a pixel.

9. The video wall module according to claim 8, wherein the pixels are arranged in a rectangular grid at the top side of the circuit board.

10. The video wall module according to claim 8, wherein the light emitting diode chips of a pixel are arranged linearly alongside one another.

11. A method of producing a video wall module comprising:
    providing a multilayer circuit board comprising a first metallization layer arranged at a top side of the circuit board;
    providing a plurality of light emitting diode chips, wherein each light emitting diode chip comprises a contact side comprising a first contact electrode arranged at the contact side and a second contact electrode arranged at the contact side; and
    arranging the light emitting diode chips at the top side of the circuit board, wherein the first and second contact electrodes electrically conductively connect to the first metallization layer,
    wherein the first contact electrode is an anode of the light emitting diode chip and the second contact electrode is a cathode of the light emitting diode chip or the first contact electrode is a cathode and the second contact electrode is an anode; and
    wherein arranging the light emitting diode chips at the top side of the circuit board comprises:
    applying an electrically insulating adhesive on the top side of the circuit board; and
    arranging the light emitting diode chips at the top side of the circuit board,
    wherein microscopic metal tips of the contact electrodes of the light emitting diode chips and/or of the first metallization layer locally pierce the electrically insulating adhesive and electrically conductively connect the contact electrodes of the light emitting diode chips to the first metallization layer.

12. The method according to claim 11, further comprising arranging a potting material at the top side of the circuit board, wherein the light emitting diode chips are at least partly embedded into the potting material.

13. A video wall module comprising a plurality of light emitting diode chips,
    each comprising first contact electrodes and second contact electrodes arranged at a contact side,
    wherein the light emitting diode chips are arranged at a top side of a multilayer circuit board,
    at the contact side of each light emitting diode chip there is arranged a patterned section of a conductive die attach film that electrically conductively connects the first and second contact electrodes of the light emitting diode chip to a first metallization layer arranged at the top side of the circuit board, and
    the first contact electrode is an anode of the light emitting diode chip and the second contact electrode is a cathode of the light emitting diode chip or the first contact electrode is a cathode and the second contact electrode is an anode.

14. A method of producing a video wall module comprising:
    providing a multilayer circuit board comprising a first metallization layer arranged at a top side of the circuit board;
    providing a plurality of light emitting diode chips, wherein each light emitting diode chip comprises a contact side comprising a first contact electrode arranged at the contact side and a second contact electrode arranged at the contact side; and arranging the light emitting diode chips at the top side of the circuit board, wherein the first and second contact electrodes electrically conductively connect to the first metallization layer, wherein providing each light emitting diode chip comprises:

arranging a section of a conductive die attach film at the contact side of the light emitting diode chip; and patterning the conductive die attach film such that parts of the conductive die attach film in contact with the first contact electrode and with the second contact electrode are electrically isolated from one another;

wherein the light emitting diode chips are arranged at the top side of the circuit board such that the respective section of the conductive die attach film electrically conductively connects the first and second contact electrodes to the first metallization layer.

15. The method according to claim 14, wherein patterning the conductive die attach film is carried out by a laser.

16. The method according to claim 14, wherein the conductive die attach film is arranged at a chip wafer comprising a plurality of light emitting diode chips, and the light emitting diode chips are singulated together with the conductive die attach film after the process of patterning the conductive die attach film.

* * * * *